United States Patent
Ling et al.

[11] Patent Number: 5,863,831
[45] Date of Patent: Jan. 26, 1999

[54] PROCESS FOR FABRICATING SEMICONDUCTOR DEVICE WITH SHALLOW P-TYPE REGIONS USING DOPANT COMPOUNDS CONTAINING ELEMENTS OF HIGH SOLID SOLUBILITY

[75] Inventors: Peiching Ling, San Jose; Tien Tien, Sunnyvale, both of Calif.

[73] Assignee: Advanced Materials Engineering Research, Inc., Sunnyvale, Calif.

[21] Appl. No.: 514,757

[22] Filed: Aug. 14, 1995

[51] Int. Cl.$^6$ .................................................. H01L 21/265
[52] U.S. Cl. ............................................... 438/515; 438/528
[58] Field of Search ................................. 437/20, 22, 24, 437/950, 959, 987, 146; 438/510, 515, 514, 528, 544

[56] References Cited

U.S. PATENT DOCUMENTS

| | | | |
|---|---|---|---|
| 5,073,507 | 12/1991 | Keller | 437/22 |
| 5,126,278 | 6/1992 | Kodaira | 437/950 |
| 5,254,484 | 10/1993 | Hefner et al. | 437/24 |
| 5,489,550 | 2/1996 | Moslehi | 437/950 |
| 5,508,208 | 4/1996 | Sato | 437/18 |

FOREIGN PATENT DOCUMENTS 5-226283(A)  3/1993  Japan ........................................ 437/24

*Primary Examiner*—John Niebling
*Assistant Examiner*—S. Mulpuri
*Attorney, Agent, or Firm*—Bo-In Lin

[57] ABSTRACT

A semiconductor having at least one p-channel transistor (10) with shallow p-type doped source/drain regions (16 and 18) which contain boron implanted into the doped regions (16 and 18) in the form of a compound which consists of boron and an element (or elements) selected from the group which consists of element of substrate (21) and elements which forms a solid solution with the substrate (21). In particular, in the case of silicon substrate, the compound may comprise $BSi_2$, $B_2Si$, $B_4Si$ and $B_6Si$. The use of such compounds enables the highly reliable contacts to be formed on the p-doped regions.

20 Claims, 1 Drawing Sheet

Cross-Sectional View of a Typical MOSFET

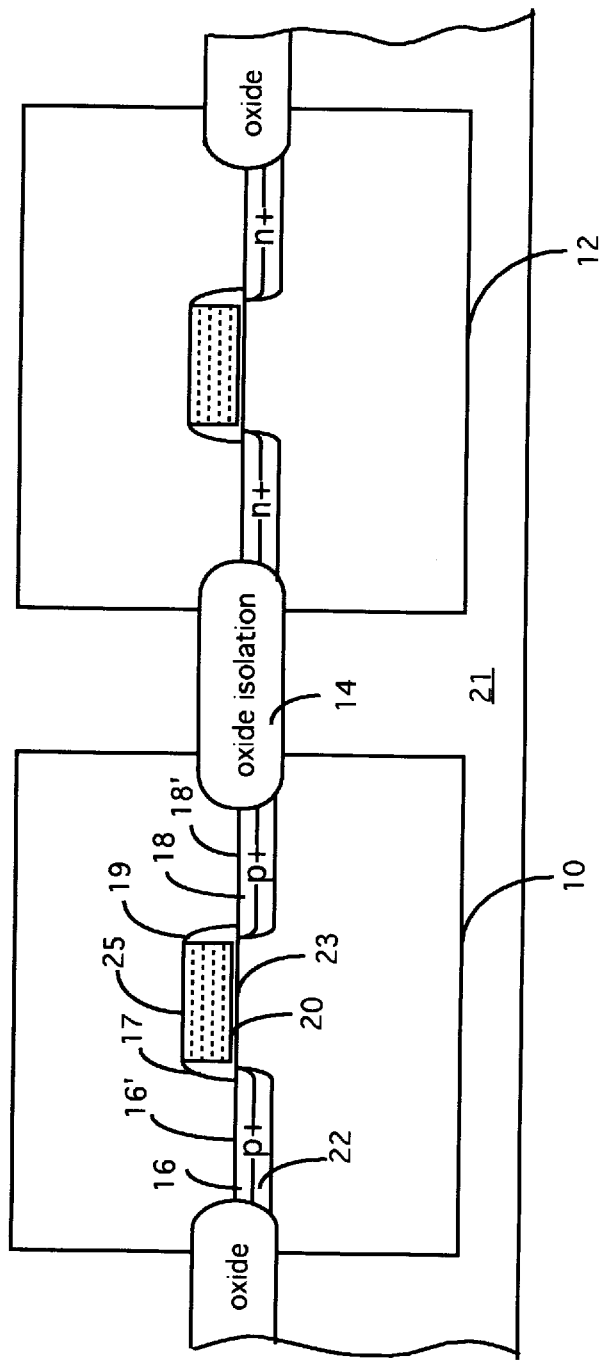
FIG. 1 Cross-Sectional View of a Typical MOSFET

PROCESS FOR FABRICATING SEMICONDUCTOR DEVICE WITH SHALLOW P-TYPE REGIONS USING DOPANT COMPOUNDS CONTAINING ELEMENTS OF HIGH SOLID SOLUBILITY

BACKGROUND OF THE INVENTION

1. Field of the Invention

The invention relates generally to the structure and fabrication process of semiconductor devices. More particularly, this invention relates to the structure and fabrication process of semiconductor devices that utilize shallow p-type regions.

2. Description of the Prior Art

As the overall dimensions of semiconductor devices are miniaturized and made ever smaller, the formation of very shallow p-doped regions, e.g., those less than a quarter-micron in depth, is becoming a major limiting factor in the fabrication process used to make metal oxide semiconductor field-effect transistors (MOSFET) and complementary metal oxide semiconductor (CMOS) devices.

The method used to make these vital CMOS and MOSFET transistors involves the formation of both n-type and p-type doped regions. Shallow n-doped regions can easily be formed by the ion implantation of arsenic or other n-type dopants. However, technical difficulties currently hamper the formation of very shallow p-doped regions. In most semiconductor fabrication processes the dopant boron is used to form p-type regions. Because boron has a very low atomic number (Z=5), a very low implantation energy must be used keep the dopant in the shallow surface region necessary for small geometry devices. Traditional ion implantation techniques are limited in their ability to produce low Z dopants with very low implantation energies. These limitations effect both the stability and reliability of shallow p-junctions. Furthermore, due to its low atomic number, implanted boron tends to channel through crystalline substrates and therefore forms a very undesirable, deep, 'implantation profile tail[1]' in which the concentration of the dopant can not be controlled. This 'channeling tail' creates great difficulties in the ability to clearly define the junction depth of boron implanted shallow p-type regions. This inability to control the junction depth seriously degrades device performance. All in all, it is not feasible to use conventional low energy implantation technology to implant boron and form shallow p-regions for very-large scale integrated (VLSI) circuits.

Several techniques are currently used to try to reduce the technical difficulties associated with low energy boron implantation. In one case the shallow p-region is formed using a heavier compound ion, i.e., BF2. Due to the higher mass of the compound, the constituent atoms of the BF2 ion have a shallower penetration depth for a given ion energy, thus enabling the formation of shallower p-type regions. The BF2 ions provide another key advantage because they help reduce problems caused by channeling effects. This improvement is accomplished by the increased crystal damage caused by the heavier fluorine component of the compound ion. However, since fluorine is neither a p-type nor n-type dopant, the fluorine atoms that are introduced from the BF2 ions do not directly contribute to the electrical performance of the semiconductor device.

The introduction of fluorine from the BF2 compound generates a new set of problems. Due to their low solubility in silicon, the fluorine atoms tend to migrate, particularly if the substrate is heated. After a BF2 implantation, any subsequent fabrication process which uses elevated temperatures, will tend to cause the implanted fluorine to migrate to the silicon surface, i.e., silicon-oxide interface. In some cases, this migration may cause the fluorine to coalesce and form a gap at the interface. Several different contact problems can be caused by migrating fluorine including; poor contact reliability, high contact resistance, and unstable electrical performance.

In addition to the contact problems caused the migration of fluorine, implantation of BF2 ions with energies less than 15 KeV can be difficult. This difficulty in turn limits the minimum depth of implantation and thus limits the miniaturization of integrated circuit (IC) devices in VLSI and ULSI applications. There are other difficulties associated with the implantation of BF2 ions including enhanced Si-epitaxial growth at the interface between silicon, i.e., the p+diffusion region, and an aluminum alloy containing silicon (a common interconnect material).

For all the above reasons, BF2 ion implantation is not a viable solution for the difficulties currently associated with the fabrication of shallow p-type regions. Therefore, there is a profound need in the art of IC device fabrication, particularly for devices requiring shallow p-type regions, to provide a fabrication process that will resolve these difficulties and limitations.

SUMMARY OF THE PRESENT INVENTION

It is therefore the object of the present invention to provide a fabrication process for forming a shallow p-type region in semiconductor devices which will overcome the difficulties encountered in the prior art.

Specifically, it is an object of the present invention to present a method for introducing a p-type dopant that is useful for the fabrication of IC devices which results in shallow-depth p-type regions, wherein the method allows for a fabrication process that can be controlled to produce a p-doped region which has a well-defined, reproducible shallow-depth and has a uniform diffusion profile.

Another object of the present invention is to provide a method for the introduction of a p-type dopant that is useful for the fabrication of IC devices which results in shallow-depth p-type regions wherein the depth of p-region is reduced while retaining the ability to form contacts at the surface of the substrate which can be made with strong adhesion, low contact resistance, and predictable, well-defined device performance characteristics.

Another object of the present invention is to provide a method for introduction of a p-type dopant that is useful for the fabrication of IC devices which results in shallow-depth p-type regions wherein the epitaxial growth at the interface between silicon and silicon-containing aluminum alloy may be reduced.

Briefly, in a preferred embodiment, the present invention discloses a method of manufacturing a semiconductor device which includes a p-channel transistor with shallow p-type region. The method includes the steps of: (a) providing a substrate material represented by a symbol C; and (b) implanting the substrate with a combination dopant represented by a symbol $A_xC'$ wherein A represents an element which is an acceptor in the substrate, C' represents an element with high solubility in the substrate material C, and x is a real number. In one implementation, step (a) of providing a substrate is achieved by providing a silicon substrate; and step (b) of implanting the substrate with a combination dopant $A_xC'$ is achieved by implanting the substrate with a dopant compound $A_xSi_y$ where x and y are real numbers. In an alternate method, step (a) of providing a substrate is achieved by providing a silicon substrate, and step (b) of implanting substrate with a combination dopant $A_xC$ is achieved by implanting the substrate with a dopant compound including $A_xGe_y$ where x and y are real numbers. In yet another method, step (a) of providing a substrate is achieved by providing a silicon substrate; and step (b) of implanting into said substrate a combination dopant $A_xC'_y$ is accomplished by implanting the substrate with a dopant compound including $A_xSi_{y1}Ge_{y2}$ where y1 and y2 are real numbers.

An advantage of the present invention is that it provides a method of introducing a p-type dopant for fabrication of IC devices that results in a shallow-depth p-type region wherein the fabrication process can be better controlled so that it will produce p-regions which have well-defined and a reproducible shallow-depth profiles and have a uniform diffusion profile thereby enhancing the miniaturization of the IC devices.

Another advantage of the present invention is that it provides a method of introduce a p-type dopant for fabrication of IC devices which results in shallow-depth p-type regions wherein the disadvantages of prior art devices including problems of weak adhesion, poor contact, surface gap, unpredictable electrical characteristics, uncertain performance variations, and poor reliability caused by fluorine migration can be resolved.

Another advantage of the present invention is that it provides a method of introducing a p-type dopant for fabrication of IC devices with shallow-depth p-type regions wherein the depth of p-region is reduced while contacts to the surface can be fabricated which have strong adhesion have low contact resistance, and have predictable, well-defined performance characteristics.

Another advantage of the present invention is that it provides a method of introduce a p-type dopant for fabrication of IC devices with shallow-depth p-type regions wherein the epitaxial growth at the interface between silicon and silicon containing aluminum alloy can be reduced.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1 is an enlarged cross-sectional view of a typical MOSFET device.

DETAILED DESCRIPTION OF THE PREFERRED EMBODIMENT

The present invention teaches a fabrication process which takes advantage of a fundamental physical phenomenon relating to 'solid solubility'. Specifically, when different types of atoms, either as a single element or as part of a compound, are introduced into a solid substrate, each type of these 'alien' atoms introduced into the substrate has a solid solubility limit, i.e., a maximum concentration of that atom which the substrate can accommodate. When the concentration of these 'alien' atoms exceeds the limit of solid solubility into the substrate, certain micro structural defects are formed. These defects then affect the targeted electrical properties of the doped regions in the semiconductor devices which in turn adversely impact device performance and reliability.

The difficulties of forming a shallow P type region in the semiconductor devices can be better appreciated now based on the above mentioned problems associated with the defects when solid solubility limits are exceeded. In order to form a P type region the acceptor elements, i.e., atoms such as boron, aluminum, gallium, indium, yttrium, etc., are introduced into a substrate. Among these elements, only boron has sufficient high solid solubility in a silicon substrate. However, since the boron atom itself is a very light atom, it is difficult to form a shallow layer by using boron atom alone as a dopant. In order to increase the weight of ions implanted into the substrate, compounds of boron are formed for implantation to reduce the depths of the doped regions. The most commonly used compound for forming the shallow P regions in the conventional fabrication process is the $BF_2$ compound wherein the fluorine atoms are added to increase the weight of the implanted ions thus reducing the depth of doped regions. However, since the fluorine atoms have a relative low solid solubility in the silicon substrate, as soon as the fluorine atomic concentration exceeds its solid solubility, the problems associated with micro structural defects occur.

Therefore, when the dopant compound $BF_2$ is implanted into a substrate to form a shallow P-type region, the solid solubility of each atom introduced into the substrate as part of the compound, i.e., the solubility of boron atoms and fluorine atoms, becomes an important parameter in determining the material behavior resulting from the doping operation. Since the boron atoms have high solid solubility in a silicon substrate, no particular problems are generated. But, as the concentration of one type of alien atoms, e.g., the fluorine atoms, introduced as part of the compound, exceeds its solubility in the substrate, this type of atoms generate structural defects in the substrate. The defects caused by these alien atoms lead to problems such as segregation, precipitation, diffusion to surface, dislocations and bubbles. Since this is the major problem encountered for fabricating the shallow p-type regions in the conventional $BF_2$ implantation process, the main subject matter of the present invention is to teach a material processing technique to improve the doping quality by employing dopant-compounds composed of atoms of high solid solubilities in the substrate. By carefully selecting dopant compounds and by controlling the atomic concentrations for each of the elements in that compound introduced into the substrate such that the concentration for each element being kept below the solid solubility of that atom, the defects are eliminated and the problems encountered in a conventional technique, e.g., $BF_2$ implantation, for forming shallow P regions are resolved.

FIG. 1 shows a cross-sectional view of a typical MOSFET device including a chip, i.e., a silicon substrate 21, with two transistors 10 and 12, i.e., a p-type transistor 10 and a n-type transistor 12 formed thereon. The transistors 10 and 12 are isolated from each other by an oxide strip 14 which is preferably a silicon dioxide strip. The transistors 10 and 12 and the isolation strips are shown as an example. For those of ordinary skill in the art, it is well known that a great number of transistors separated by isolation oxide regions may be formed on a silicon chip. The description of the transistor structure will be focused on the p-type transistor for understanding the novel features of the present invention.

Referring to FIG. 1 for the p-type transistor 10 which includes a pair of p-doped source and drain regions 16 and 18 respectively separated by a gate electrode 20. The source region 16, the drain region 18 and the gate electrode 20 are formed on a lightly doped silicon substrate 21. The gate electrode 20 is insulated by an insulating layer 23 and covered by a conductive layer 25 formed on top of the insulating layer 23. The gate electrode 20 is surrounded by spacer 17 and 19 which are used as masks for the formation of the source and drain regions 16 and 18. Two surface layers 16' and 18' are formed on top of the source and drain regions 16 and 18 respectively to serve as contact for electrical connection for the source and drain region 16 and 18 to other circuits (not shown) to be fabricated in subsequent manufacturing steps. The doped source and drain regions 16 and 18 are formed by the use of boron compounds containing atoms identical to that of the substrate material. For example, for a silicon substrate, the dopants for the shallow p-type regions are doped with compound of $B_xSi_y$ where x and y are the atomic ratios of the boron atoms and the silicon atoms contained in the dopant compound, respectively. In addition to dopant compounds as disclosed above, if a boron compound containing atoms of substrate material which exist in a stable form, e.g., $B_2Si$, $B_4Si$, and $B_6Si$, are not suitable for particular applications, then boron dopant compounds can also be formed with atoms of material types which have high solubility in the substrate. For example, a dopant compound can be formed as $B_xGe_y$ where the germanium atoms have broad range of solubility in the silicon substrate. An alternate set of preferred dopants for forming a shallow p-type region are ternary boron compounds including atoms of the substrate material and element that forms solid solution with the substrate material, e.g., Ge. A ternary born compound such as $B_xSi_yGe_z$ would be suitable for this application to form shallow p-type regions in a silicon substrate.

Among the boron dopant compounds of $B_xSi_y$, several of these compounds, e.g., $B_2Si$, $B_4Si$, and $B_6Si$, are available commercially. These compounds exist as solid powders at room temperature under atmospheric pressure. As an example, one of these compounds can be implanted in the silicon substrate to form a shallow p-type region by the following processes. A $B_xSi_y$ compound is placed in a Knudsen cell equipped with a small orifice. The Knudsen cell is a vessel used to measure a very low vapor pressure by measuring the weight of vapor which escapes when the vessel containing a solid or liquid in equilibrium condition with the vapor. The knudsen cell is placed in a furnace with a vacuum pump connected thereto. The temperature is elevated by applying heat to the compound by the furnace. Depending on the vapor pressure, the boron compound $B_xSi_y$ begins to evaporate above a certain temperature. The evaporated compound is directed to effuse in forming a collimated molecular beam. The beam is ionized to become an ion compound of a composite dopant and accelerated and applied as implanting ion beam to an unmasked area in the silicon substrate. Shallow p-type regions are thus formed with boron dopant selected from one of the composition forms among compounds $B_2Si$, $B_4Si$, or $B_6Si$. In addition to the processing steps as described for preparation of ion sources, a physical sputtering method can also be used. Control and measurement of ion concentrations for different ions including $BSi_2+$ $BSi_2++$, $BSi_3+$, and $BSi_4++$, can be achieved by the use of secondary ion mass spectroscopy (SIMS). Other ion formation and implantation methods, including plasma ion implantation, electron bombardment ionization, and other types of conventional ion source/accelerator combinations can be used to form and accelerate the ions necessary to accomplish the methods disclosed in this patent application.

When the shallow p-type regions 16 and 18 are formed with an ion compound of a composite dopant of p-type dopant, the silicon atoms in the composite implanted ion dopant are identical to those silicon atoms in the substrate. The implanted silicon is indistinguishable from the silicon substrate 21. The contact 16' and 18' can be formed and securely bonded to the silicon surface without being separated by the migrating fluorine atoms as that encountered in the prior art. In addition, silicon being much more massive than boron, creates damage in the crystalline substrate, thereby minimizing the 'channeling tail' and improving the electrical activation of the implanted boron during subsequent annealing.

Similarly, when the boron-germanium or boron-silicon-germanium compounds are used for implantation into a silicon substrate 21, the germanium atoms which are implanted in the p-type region are readily soluble in the silicon substrate. This is because germanium atoms can form a continuous solid solution with silicon over a broad composition range. Furthermore, germanium has similar electrical, physical, and chemical properties as that of silicon. Because of the high solubility, no segregation of germanium occurs in the subsequent processing steps. The electrical and other performance characteristics are not affected due to the presence of the germanium atoms in the p-type region. There is no migration of germanium atoms to the surface at an elevated temperature in the substrate. Thus, contacts or any thin film to be formed on the silicon surface are not affected by the use of the germanium as a part of the dopant compounds. High reliability and controllable, predictable electrical performance characteristics can be achieved by forming the shallow p-type regions via the use of the boron-silicon, boron-germanium or boron-silicon-germanium compounds as dopants.

In summary, this invention teaches a method of manufacturing a semiconductor devices which include a p-channel transistor with shallow p-type regions. The method includes the step of: (a) providing a substrate composed of a material represented by a symbol C; and (b) imnplanting the source/drain with a combination dopant represented by a symbol $A_xC'$ wherein A represents an electron acceptor and C' represents an element with high solubility in the substrate material C, and where x is a real number. In another method, the step (a) of providing a substrate is accomplished by providing a silicon substrate; and the step (b) of implanting the source/drain a combination dopant including $A_xSi_y$ where x and y are real numbers. In an alternate method, the step (a) of providing a substrate being accomplished by providing a silicon substrate; and the step (b) of implanting the source/drain a combination dopant $A_xC'$ being a step of implanting the substrate a dopant compound including $A_xGe_y$ where x and y are real numbers. In yet another method, the step (a) of providing a substrate is accomplished by providing a silicon substrate; and the step (b) of implanting said source/drain a comnbination dopant including $A_xSi_{y1}Ge_{y2}$ where y1 and y2 are real numbers.

This inventon also discloses a method of implanting a compound into substrate. The method includes the steps of (a) selecting the compound containing atoms having high solid solubility in the substrate; (b) energizing the compound and introducing the compound into the substrate as energied ions; and (c) maintaining an aomic concentration of each of the atoms in the substrate below a solid solubility for each of the atoms in the substrate whereby a defect in the substrate is prevented thereby.

In an alternate preferred embodiment, the present invention farther teaches a method of performing a plasma ion implantation for introducing a compound into substrate. The method includes the steps of: (a) selecting several atoms for making the compound wherein each of the several atoms having high solid solubility in the substrate; (b) introducing a gas flow for each of the atoms into a plasma generating chamber for generating the compound in a plasma form; (c) energizng the plasma compound and introducing the compound into the substrate as energized ions; and (d) maintaining an atomic concentration of each of the atoms in the substrate below a solid solubility for each of the atoms in the substrate whereby a defect in the substrate is prevented thereby.

In addition to the dopant compounds described above, a series of compounds, including but not limited to compounds such as boron-Sn and boron-Pb, can also be used to create the shallow p-type regions. The non-Goron atoms in these compounds are highly soluble in the silicon substrate. The undesirable effects of segregation and migration are eliminated when solid solutions are formed in the silicon substrate.

The implantation methods described above are for the fabrication of a MOSFET device. The dopants and techniques described for forming shallow p-regions however are applicable to a wide ranger of devices. To those of ordinary skill in the art, it is obvious how to apply these techniques to devices such as bipolar, pnp transistors, the integrated injection logic (I2L), GaAs devices, i.e., the III–V semiconductors, silicon-on-insulator (SOI) devices, etc. In addition to transistors, such technology is also applicable for fabrication of diffused capacitors, resistors and other types of circuit components whenever shallow p-type of doped regions are involved.

This invention thus teaches a method for fabricating a semiconductor device with shallow p-type regions. The shallow depth of the p-type regions is achieved by the use of $B_xSi_y$, or boron-germanium or boron-silicon-germanium compounds as the implanted compounds. A new dopant and fabrication process of forming a shallow p-type region for a semiconductor device are herein provided to overcome the difficulties encountered in the prior art. The p-type dopant for fabrication of IC devices with shallow-depth p-type regions which are provided wherein allow the fabrication process to be better controlled and will produce a p-region with a well-defined and reproducible shallow-depth and having uniform diffusion profile useful to enhance the miniaturization of the IC devices. The disadvantages of prior art devices including problems of weak adhesion, poor contact, surface gap, uncertain performance variations, unpredictable electrical characteristics, and poor reliability caused by fluorine migration are therefore resolved. The shallow-depth p-type regions that are formed wherein have the advantage that the depth of p-region is reduced while contacts on the surface can be fabricated with strong adhesion and have low contact resistance with predictable and well-defined performance characteristics. Furthermore, a p-type dopant for fabrication of IC devices with shallow-depth p-type regions are provided wherein which help reduce the epitaxial growth at the interface between silicon and aluminum alloy containing silicon.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method of manufacturing a semiconductor device which includes p-type regions, comprising the steps of:
   (a) providing a substrate composed of a material represented by a symbol C; and
   (b) implanting into said substrate an ion compound of a composite dopant represented by a symbol $A_xC_y$ wherein A representing a composition includes at least a single element useful as an acceptor in said substrate and C having a solid solubility higher than a solubility of a fluorine ion in said substrate where x and y are real numbers.

2. A method of manufacturing a semiconductor device that indudes p-type regions, comprising the steps of:
   (a) providing a substrate composed of a material represented by a symbol C; and
   (b) implanting into said substrate an ion compound of a composite dopant represented by a symbol $A_xC'_y$ wherein A representing an acceptor and C' representing an element for forming a solid solution in said substrate and having a solid solibility higher than a solubility of a fluorine ion in said substrate where x and y are real numbers.

3. The method of claim 1 wherein:
   said step (a) of providing a substrate being accomplished by providing a silicon substrate; and
   said step (b) of implanting into said substrate an ion compound of a composite dopant $A_xC_y$ being accomplished by implanting said substrate a dopant compound including $A_xSi_y$ where x and y are real numbers.

4. The mehod of claim 3 wherein:
   said step (b) of implanting into said substrate an ion compound of a composite dopant $A_xSi_y$ being accomplished by implanting said substrate an ion compound including $B_xSi_y$ where x and y are real numbers.

5. The method of claim 4 wherein:
   said step (b) is accomplished by implanting said substrate an ion compound by using $BSi_4$ as a source to produce said dopant compound of $B_xSi_y$.

6. The method of claim 4 wherein:
   said step (b) is accomplished by implanting said substrate an ion compound by using $BSi_6$ as a source to produce said dopant compound of $B_xSi_y$.

7. The method of claim 2 wherein:
   said step (a) of providing a substrate being accomplished by providing a silicon substrate; and
   said step (b) of implanting into said substrate an ion compound of a compound dopant $A_xC'_y$ being accomplished by implanting said substrate an ion compound of a dopant compound including $A_xGe_y$ where x and y are real numbers.

8. The method of claim 3 wherein:
   said step (a) of providing a substrate being accomplished by providing a silicon substrate; and
   said step (b) of implanting into said substrate an ion compound of a compsite dopant $A_xC'_y$ being accomplished by implanting said substrate an ion compound of a said composite dopant including $A_xSi_{y1}Ge_{y2}$ where x, y1 and y2 are real numbers.

9. The method of claim 7 wherein:
   said step (b) of implanting into said substrate an ion compound of a composite dopant $A_xGe_y$ being accomplished by implanting said substrate a dopant compound including $B_xGe_y$ where x and y are real numbers.

10. The method of claim 8 wherein:

said step (b) of implanting into said substrate an ion compound of a composite dopant $A_xSi_{y1}Ge_{y2}$ being accomplished by implanting said substrate a dopant compound including $B_xSi_{y1}Ge_{y2}$.

11. A method of manufacturing a semiconductor device which includes p-type regions, comprising the steps of:

(a) providing a substrate composed of a material represented by a symbol C; and (b) select several atoms for making a compound represented by a symbol $A_xC_y$ wherein A representing an acceptor and C representing an element having a solid solubility higher than a solubility of a fluorine ion in said substrate where x and y are real numbers; and (c) introducing each of said atoms into a plasma generating chamber for generating a plasma of said compound;

(d) energizing said plasma of said compound into an ion compound and introducing said ion compound into said substrate as an ion compound of a composite dopant.

12. A method of manufacturing a semiconductor device that includes p-type regions, comprising the steps of:

(a) providing a substrate composed of a materail represented by a symbol C; and (b) selecting several atoms for making a compound represented by a symbol $A_xC'_y$ wherein A represent an acceptor and C' representing an element for forming a solid solution in said substrate and having a solid solubility higher than a solubility of a fluorine ion in said substrate where x and y are real numbers;

(c) introducing each of said atoms into a plasma generating chamber for generating a plasma of said compound; and (d) energizing said plasma of said compound into an ion compound and introducing said ion compound into said substrate as an ion compound of a composite dopant.

13. The method of claim 11 wherein:

said step (a) of providing a substrate being accomplished by providing a silicon substrate; and said step (b) of selecting several atoms for making said compound represented by a symbol $A_xC_y$ being accomplished by selecting said atoms for a compound of $A_xSi_y$ where x and y are real numbers.

14. The method of claim 13 wherein:

said step (b) of selecting several atoms for an ion compound represented by a symbol $A_xSi_y$ being accomplished by selecting said atoms for making a compound of $B_xSi_y$ where x and y are real numbers.

15. The method of claim 14 wherein:

said step (b) is accomplished by making said compound by using $BSi_4$ as a source to produce said compound of $B_xSi_y$.

16. The method of claim 14 wherein:

said step (b) is accomplished by making said compound by using $BSi_6$ as a source to produce said compound at $B_xSi_y$.

17. The method of claim 12 wherein;

said step (a) of providing a substrate being accomplished by providing a silicon substrate; and said step (b) of selecting several atoms for making said compound represented by a symbol $A_xC'_y$ being accomplished by selecting said atoms for making a compound of $A_xGe_y$ where x and y are real numbers.

18. The method of claim 17 wherein:

said step (b) of makng said compound of $A_xGe_y$ being accomplished by using $B_xGe_y$ as a source.

19. The method of claim 12 wherein:

said step (a) of providing a substrate being accomplished by providing a silicon substrate; and said step (b) of selecting several atoms for making said compound represented by a symbol $A_xC'_y$ being accomplished by selecting said atoms for making a compound of $A_xSi_{y1}Ge_{y2}$ where x, y1 and y2 are real numbers.

20. The method of claim 19 wherein:

said step (b) of making said compound of $A_xSi_yGe_{y2}$ being accomplished by using $B_xSi_{y1}Ge_{y2}$ as a source.

* * * * *